United States Patent [19]

Miyauchi et al.

[11] Patent Number: 4,827,327
[45] Date of Patent: May 2, 1989

[54] INTEGRATED CIRCUIT DEVICE HAVING STACKED CONDUCTIVE LAYERS CONNECTING CIRCUIT ELEMENTS THERETHROUGH

[75] Inventors: Akira Miyauchi, Kawasaki; Hiroshi Nishimoto, Tokyo; Tadashi Okiyama; Hiroo Kitasagami, both of Kawasaki; Masahiro Sugimoto, Yokosuka; Haruo Tamada, Yokohama; Shinji Emori, Urawa, all of Japan

[73] Assignee: Fujitsu Limited, Kawasaki, Japan

[21] Appl. No.: 214,838

[22] Filed: Jul. 5, 1988

Related U.S. Application Data

[63] Continuation of Ser. No. 849,439, Apr. 8, 1986, abandoned.

[30] Foreign Application Priority Data

Apr. 13, 1985 [JP] Japan .................................. 60-077549

[51] Int. Cl.$^4$ ...................... H01L 23/14; H01L 23/52
[52] U.S. Cl. ......................................... 357/71; 357/74; 357/80
[58] Field of Search .................. 357/68, 75, 74, 80, 357/70, 71; 174/68.5, 52 FP; 361/401; 333/247, 246, 243, 244

[56] References Cited

U.S. PATENT DOCUMENTS

| | | | |
|---|---|---|---|
| 4,320,438 | 3/1982 | Ibrahim et al. | 361/401 |
| 4,498,122 | 2/1985 | Rainal | 174/68.5 |
| 4,541,035 | 9/1985 | Carlson et al. | 174/68.5 |
| 4,608,592 | 8/1986 | Miyamato | 357/80 |

Primary Examiner—Andrew J. James
Assistant Examiner—Sheila V. Clark
Attorney, Agent, or Firm—Staas & Halsey

[57] ABSTRACT

An integrated circuit device including a stacked layer unit having a plurality of stacked layers each having an insulation layer and at least one conductive layer strip formed on a surface of the insulation layer, and at least one chip mounted on the top of the insulation layer and having a plurality of circuit elements. The IC device also includes at least one first conductive member formed in the stacked layer unit, having a low inductance for first signals applied thereto and operatively connecting the first signals to be transferred between the circuit elements. The IC device further includes at least one second conductive member formed in the stacked layer unit, having a higher inductance for the first signals than that of the first conductive member and operatively connecting second signals to be transferred between the circuit elements the stacked layer unit, the chip, and the first and second conductive members are enclosed by a package and sealed with a hermetic seal.

22 Claims, 3 Drawing Sheets

INTEGRATED CIRCUIT DEVICE HAVING STACKED CONDUCTIVE LAYERS CONNECTING CIRCUIT ELEMENTS THERETHROUGH

This is a continuation of co-pending application Ser. No. 849,439, filed on Apr. 8, 1986, now abandoned.

BACKGROUND OF THE INVENTION

1. Field of the Invention

The present invention relates to an integrated circuit device. More particularly, it relates to an integrated circuit device suitably applicable to a high speed operation circuit and having stacked conductive layers connecting circuit elements in the device with inductive elements embedded therein.

2. Description of the Related Art

Semiconductor integrated circuit (IC) chips in which a plurality of circuit elements, such as transistors and resistors, are formed in a semiconductor chip of silicon (Si), gallium-arsenic (GaAs), etc., and which, for example, are operable for high-speed, e.g., one giga bits per second, data processing or optical data processing, are known. Such semiconductor IC chips must be hermetically sealed by a package in the same way as for normal semiconductor IC chips.

In high speed IC devices, connection wires (leads) of resistive material between circuit elements in the device, must be regarded as not only resistance components but also as inductance components, due to the application of a high thereon and wires having a low resistance and low inductance are required for high speed signal transfer lines. On the other hand, wires having a high inductance are required for power supply lines and low speed signal transfer lines, to improve isolation between different power sources and between the circuit elements in the device. In high speed IC devices, an impedance matching of the connection wires is also required, and thus wire connection technology as used in well known normal semiconductor IC devices cannot be used. Accordingly, the high speed IC devices are provided with multi-stacked layers, each consisting of a dielectric layer and a plurality of conductive layer strips, and connection members are embedded in the multi-stacked layers in a direction perpendicular to the planes of the stacked layers. The IC chip in which the circuit elements are formed is mounted on the top of the stacked layers and hermetically sealed by the package. The connection of the circuit elements in the IC device is achieved by the connection members and the conductive layer strips of the multi-stacked layers In the prior art high speed IC devices, however viaholes, which are formed with an electrical conductive material therein forming for the connection members in the stacked layers, are identical in size with the result that the cross-sectional areas of the connection members for high speed signal transfer are identical in size to the connection members of the power supply This discrepancy to the above requirement, that is, low inductance for high speed signal transfer and not necessarily low inductance for power supply and low speed signal transfer, may be acceptable for low speed IC devices, e.g., those carrying signals of lower than one giga bit per second. However, the above discrepancy is not acceptable for high speed IC devices, e.g., these carrying signals of more than several giga bits per second, because, even if each circuit element has a high speed characteristic, a high speed operation of the high speed IC devices cannot be obtained.

SUMMARY OF THE INVENTION

An object of the present invention is to provide an integrated circuit device operable for high speed signals.

Another object of the present invention is to provide an integrated circuit device having an improved noise resistance and isolation between circuits under the application of high speed signals.

According to the present invention, there is provided an integrated circuit (IC) device including: a stacked layer unit including a plurality of stacked layers each having an insulation layer and at least one conductive layer strip formed on a surface of the insulation layer; at least one chip mounted on the top of the insulation layer of the stacked layer in the stacked layer unit and including a plurality of circuit elements; at least one first conductive member formed in the stacked layer unit, having a low inductance for first signals applied thereto and operatively connecting the first signals to be transferred between the circuit elements in the chip; at least one second conductive member formed in the stacked layer unit, having higher inductance for the first signals than that of the first conductive members and operatively connecting second signals to be transferred between the circuit elements in the chip; and a package enclosing the stacked layer unit, the chip and the first and second conductive members with a hermetic seal. Each of the first and second conductive members may include a viahole formed in the insulation layer(s) of the stacked layer unit and operatively connected to one of the conductive layer strips at any stacked layer, or to two conductive layer strips placed on different insulation layers at the end(s) thereof.

According to an aspect of the present invention, preferably, the first members have a large crosssectional area and the second conductive members have a small cross-sectional area, when the first and second conductive members are formed of the same conductive material. The cross-sectional area of each first conducive member may be defined in such a way that a predetermined low inductance for a predetermined frequency is obtained for the first signal. Also, the cross-sectional area of each second conductive member may be defined in such a way that a predetermined high inductance is obtained for the first signal.

According to another aspect of the present invention, preferably, each of the first conductive members have a short length along an axial line of the viahole and each of the second conductive members have a long length along the same axial line, when the first and second conductive members are formed of the same conductive material. The short length of each of the first conductive members may be defined in such a way that a predetermined low inductance is obtained for the first signal.

Also, the long length of each of the second conductive members may be defined in such a way that a predetermined high inductance is obtained for the first signal.

According to still another aspect of the present invention, more preferably, the first conductive members have a large cross-sectional area and a short length along an axial line of the viahole, and the second conductive members have a small cross-sectional area and long length along the same axial line, when the first and second conductive members are formed of the same conductive material. The short length and large cross-sectional area of each of the first conductive members may be defined in such a way that a predetermined low inductance is obtained for the first signal. Also, the long length and small cross-sectional area of each of the second conductive members may be defined in such a way that a predetermined high inductance is obtained for the first signal.

According to yet another aspect of the present invention, the second conductive members may include coil(s) inserted into a throughhole(s), and having a high inductance.

BRIEF DESCRIPTION OF THE DRAWINGS

Other objects and features of the present invention will be described below in detail with reference to the accompanying drawings, in which.

DESCRIPTION OF THE PREFERRED EMBODIMENTS

Figure 1:
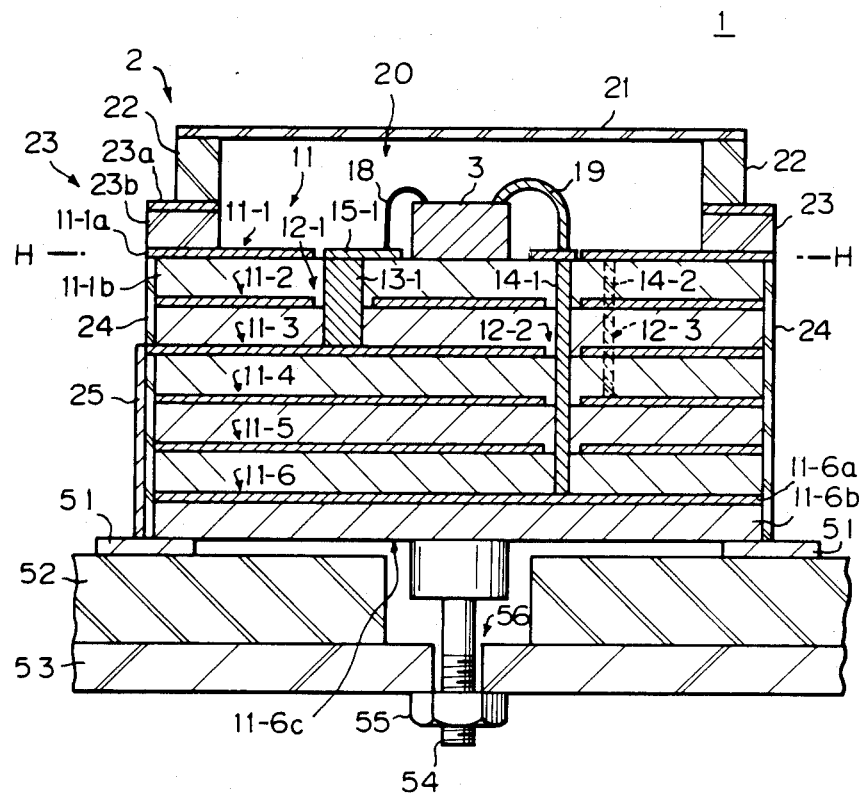
FIG. 1 is a cross-sectional view of an integrated circuit (IC) device of an embodiment in accordance with the present invention, taken along the line X—X' in FIG. 2.
Figure 3:
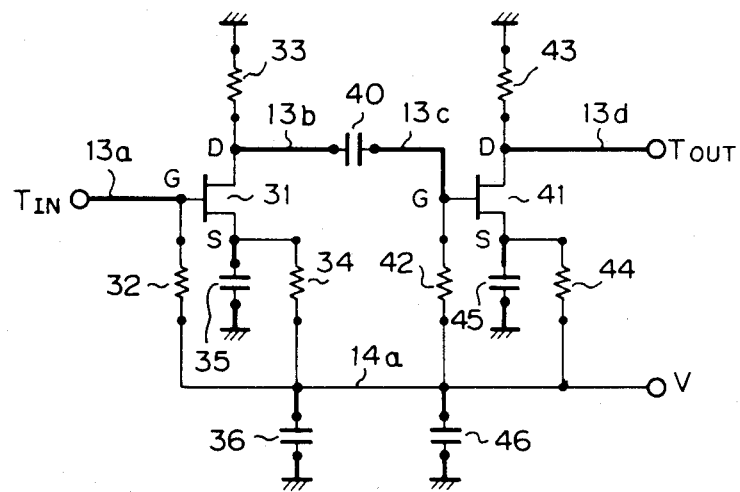
FIG. 3 is a circuit diagram of the IC device shown in FIG. 1.

Referring to FIG. 1, an IC device 1 of an embodiment in accordance with the present invention includes a package 2 consisting of a cap 21 formed of an insulation material, an upper shield wall 22 formed of an insulation material, a seal layer 23 and a side wall 24 formed of an insulation material, an IC chip 3 including circuit elements as shown in FIG. 3, and a stacked layer unit 11. The IC chip 3 is mounted on the top of the stacked layer unit 11 and is located in a hermetically sealed cavity 20 defined by the package 2 and the stacked layer unit 11. The above insulation material is, more generally speaking, a dielectric material.

The IC device 1 is mounted on a printed circuit board 52 through conductive leads 51 and secured to a plate 53 through a stud 54 having one end fixed to a bottom surface 11-6C of the stacked layer unit 11, the shaft of the stud 54 passing through a hole 56 in the printed circuit board 52 and the plate 53, and the other end of the stud 54 being fastened thereto by a nut 55.

Figure 2:
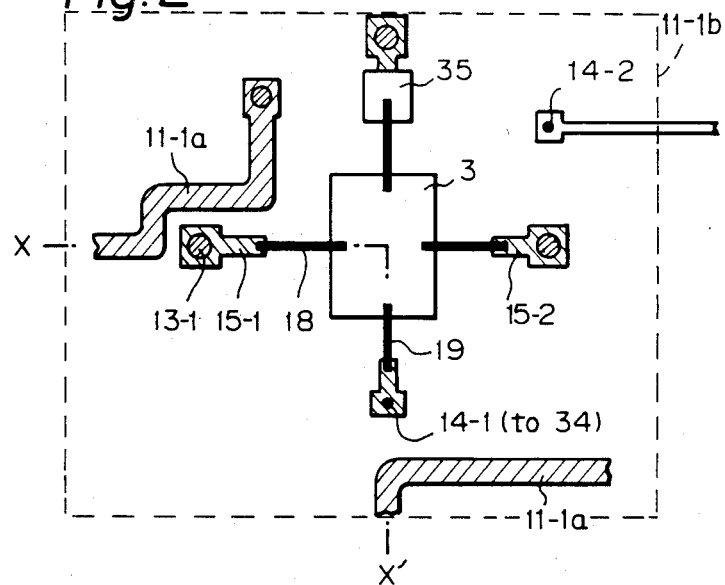
FIG. 2 is a plan view of the IC device in FIG. 1, taken along the line H—H' in FIG. 1.

The stacked layer unit 11 includes six stacked layers 11-1 to 11-6. Each of the stacked layers 11-1 to 11-6 includes an insulation layer (or dielectric layer) as shown by the layer 11-1b for the upper layer 11-1, and at least one conductive layer strip as shown by the strip 11-1a. The insulation layers 11-1b, etc., are formed of a sintered ceramic and have a thickness of, for example, 250 μm. An exemplary plan view of the upper layer 11-1 (hereinafter called chip mount layer) is shown in FIG. 2. A plurality of conductive layer strips 11-1a are provided on the insulation layer 11-1b as microstrip lines around the IC chip 3.

A plurality of microstrip lines 15-1 and 15-2 are also provided on the insulation layer 11-1b adjacent to the IC chip 3.

The conductive layer strips of the second layer 11-2 are used for ground lines or power supply lines, and thus the second layer 11-2 hereinafter is called a ground layer. The conductive layer strips of the fourth and sixth layers 11-4 and 11-6 are also used for ground lines or power supply lines. Conductive layer strips of the third layer 11-3 are used for high speed signal lines, and thus the layer 11-3 is hereinafter called a high speed signal layer. The conductive layer strips of the fifth layer 11-5 are used for low speed signal lines, and thus the layer 11-5 is hereinafter called a low speed signal layer.

In FIG. 1, the conductive layer strip of the high speed signal layer 11-3 is provided between the conductive layer strips of the ground layers 11-2 and 11-4, forming a triplate strip line structure of these three layers 11-2 to 11-4 suitable for an impedance matching of, for example, 50Ω or 75Ω. The conductive layer strip of the high speed signal layer 11-3 is led to the outside by a coplaner strip 25, having a constant characteristic impedance independent of distance, provided on an outer wall of the side wall 24.

Conductive members 13-1, 14-1 and 14-2 consist of viaholes 12-1 to 12-3 formed vertically to the plane of the chip mount layer 11-1 in the stacked layer unit 11. The first conductive member 13-1 has a large cross-sectional area, but the second conductive members 14-1 and 14-2 have a small cross-sectional area which is the same for both the conductive members 14-1 and 14-2. The first conductive member 13-1 is shorter than the second conductive members 14-1 and 14-2. The conductive member 14-1 is longer than the conductive member 14-2. When these conductive members 13-1, 14-1, and 14-2 are made of the same conductive material, such as tungsten (w) or molybdenum (Mo), the first conductive member 13-1 has the lowest resistance and the conductive member 14-1 has the highest resistance. Taking into account an inductance which may appear due to the application of a high frequency, the first conductive member 13-1 may have a small inductance, and the conductive member 14-1 may have a large inductance.

In the same way, the ground layer 11-4, the low speed signal layer 11-5, and the ground layer 11-6 are also constructed as a triplate strip line structure. In addition, the seal layer 23 has an insulation layer 23b and a conductive layer 23a as for the ground layer which is connected to the ground layer 11-2, and accordingly, the seal layer 23 functions not only as the hermetic sealing but also as the ground layer. The seal layer 23a, the chip mount layer 11-1, and the ground layer 11-2 are formed as a partial-triplate strip line. These triplate strip line structures are also suitable for impedance matching.

The above stacked layer unit 11 and the conductive members 13-1, 14-1 and 14-2 are formed by the following steps;

(1) preparing thin ceramic films having a thickness of 250 μm, i.e., so-called green sheets, forming insulation layers 11-1b to 11-6b;

(2) making viaholes (12-1 to 12-3) by punching holes and filling the holes with conductive material, for example, tungsten (W) or molybdenum (Mo), (3) patterning and forming the conductive layer strips 11-1a to 11-6a of, for example, tungsten (W) or molybdenum (Mo), and having a thickness of, for example, 15

μm, and a width of, for example, 100 μm or more, on the insulation layers 11-1b to 11-6b;

(4) stacking the insulating layers 11-1b to 11-6b having the conductive layer strips 11-1a to 11-6a formed thereon and the viaholes 12-1 to 12-3;

(5) sintering the same stacked layers at a temperature high enough, for example, 1500° C., to sinter the ceramic films.

Referring to FIG. 3, the IC chip 3 in FIG. 1 includes a field effect transistor (FET) 31 with resistors 32 to 34, and capacitors 35 and 36 at the outside of the IC chip 3, forming a first stage circuit. An FET 41, resistors 42 to 44, and capacitors 45 and 46, forming a second stage circuit, and a cut-off capacitor 40 between the first and second stage circuits are also mounted in the package by other chips not shown in FIGS. 1 and 2. In FIG. 3, lead wires between the above circuit elements are indicated by bold lines, for example, 13a, 13b, 13c, 13d, are high-speed signal transfer lines. Other wires between other circuit elements and indicated by thin lines, e.g., 14a, are low-speed signal transfer lines. Power is supplied through a terminal V or by grounding.

As described above, in order to ensure a high speed signal propagation, the lead wires for high speed signal transfer must have a low inductance, to avoid signal propagation delay and wave distortion. Accordingly, as shown in FIG. 1, the high speed signal transfer lead wires 13a to 13d, etc., are formed by a bold wire 18 having a large cross-sectional area and a short length, a microstrip line 15-1 having a low impedance and used for impedance matching, a conductive member 13-1, and a conductive layer strip of the high speed signal layer 11-3. These elements have an essentially low resistance for a low frequency signal, but inductance components are added by applying a high frequency signal of, for example, several giga bits per second. The inductance values appearing in these connection members 18, 15-1, 13-1, and 11-3 may be kept at a low level due to the above structure, nature, and features. The diameter of the conductive member 13-1 of tungsten (W) or molybdenum (Mo) is, for example, 1 mm, and the length is 1 mm.

Consequently, signals passing through a path including, in FIG. 3 for example, an input terminal $T_{IN}$, a gate of the FET 31, a drain of the FET 31, the capacitor 40, a gate of the FET 41, a drain of the FET 41, and an output terminal $T_{OUT}$, may be propagated at a high speed defined by the response characteristic of the FETs 31 and 41, etc.

The lead wire 13a in FIG. 3 may be formed by the conductive layer strip of the high speed signal layer 11-3, the conductive member 13-1, the microstrip line 15-1, and the wire 18. In this path, the impedance matching is carried out at the triplate strip line of the high speed signal layer 11-3 and the microstrip line 15-1.

On the other hand, in order to ensure isolation between different power supplies and between the circuits, the lead wires for low speed signal transfer, power supply, etc., preferably have a higher inductance than that of the high speed signal transfer lead wires. Accordingly, as shown in FIG. 1, the power supply lead wires are formed by a lead wire 19, the conductive member 14-1, and the ground layer 11-6, or the conductive member 14-2 and the ground layer 11-4. These connection members have a small cross-sectional area and a long length, and have a high resistance, with the result that a high inductance appears due to the application of a high frequency signal. As a result, the high speed signals on the power supply lead wires are attenuated, improving the isolation between different power sources, and thus improving the resistance to noise.

Figure 4:
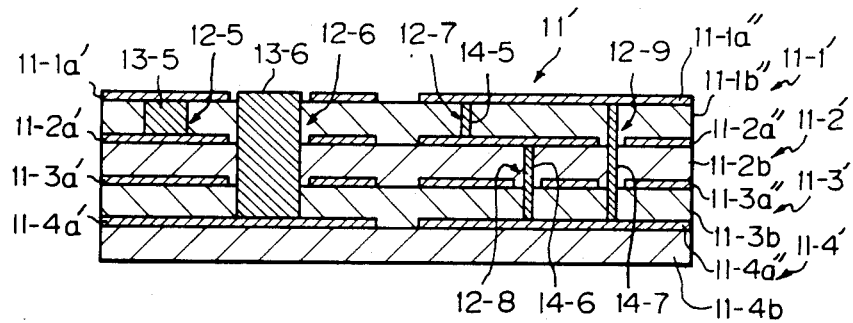
FIG. 4 is a cross-sectional view of a part of an IC device of another embodiment in accordance with the present invention.

FIG. 4 shows another stacked layer unit 11' including layers 11-1' to 11-4'. Conductive members 13-5, 13-6 and 14-5 to 14-7 consist of viaholes 12-5 to 12-9, respectively. The conductive members 13-5 and 13-6 have a large cross-sectional area, and thus a low inductance and low inductance for a high frequency signal, and accordingly, may be used as the high speed signal transfer lead wires. The ends of the conductive member 13-5 are placed in contact with the adjacent conductive layer strips 11-1a' and 11-2a', respectively, and thus the length of the conductive member 13-5 is short. One end of the conductive member 13-6 is placed in contact with a bottom conductive layer strip 11-4a', and the other end is connected to a circuit element on the IC chip through a lead (not shown), thus the length of the conductive member 13-6 is longer than that of the conductive member 13-5. In order to obtain a low inductance for a high frequency signal, in the same way as for the conductive member 13-5, the cross-sectional area of the conductive member 13-6 is made larger than that of the conductive member 13-5. These lengths and cross-sectional areas may be designed to have a suitable low impedance by taking into account the material to be used therefor.

The conductive members 14-5 to 14-7 have a small cross-sectional area, and thus may be used for low speed signal transfer lead wires, including power supply lines. The cross-sectional areas of the conductive members 14-5 to 14-7 are the same in this embodiment. The conductive member 14-5 is placed in contact with the adjacent conductive layer strips 11-1a' and 11-2a'' electrically isolated from the conductive layer strips 11-1a' and 11-2a', respectively. The conductive member 14-6 is also placed in contact with the conductive layer strips 11-2a'' and 11-4a'' electrically isolated from the conductive layer strip 11-4a'. The conductive member 14-7 is placed in contact with the conductive layer strips 11-1a' and 11-4a''. The conductive members for the low speed signal transfer and power supply are preferably formed with a small uniform cross-sectional area, to facilitate design and patterning of the viaholes and the conductive members.

Figure 5:
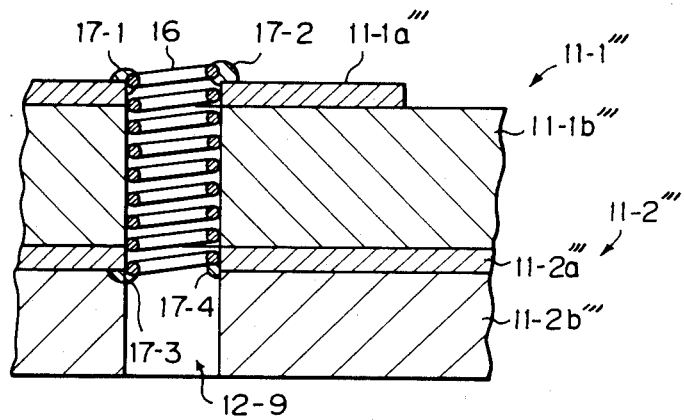
FIG. 5 is a cross-sectional view of a part of an IC device of still another embodiment in accordance with the present invention.

FIG. 5 is a partial cross-sectional view of layers 11-1''' and 11-2''' and a coil 16 inserted in a throughhole 12-9 formed in the layers 11-1''' and 11-2'''. One end of the coil 16 is connected to a conductive layer strip 11-1a' and the other end of the coil is connected to a conductive layer strip 11-2a''', by sintered conductive paint pads 17-1 to 17-4. The coil 16 has a large inductance, as described later, and thus may be used for the power supply lines.

The above construction may be formed by the following steps;

(1) preparing thin ceramic films having a thickness of, for example, 250 μm, to form insulation layers 11-1b''' and 11-2b''';

(2) patterning and forming conductive layer strips 11-1a''' and 11-2a''' having a thickness of, for example, 15 μm, on the insulation layers 11-1b''' and 11-2b''';

(3) forming a throughhole 12-9 in a position where the conductive layer strips do not exist in the insulation layers 11-1b'' and 11-2b'';

(4) inserting the coil 16 in the throughhole 12-9;

(5) coating the conductive paint pads 17-1 to 17-4 on the ends of the coil 16;

(6) stacking the insulation layers 11-1b " and 11-2b"; and (7) sintering the stack at a high temperature of approximately 1500° C.

The material of the coil 16 may be tungsten (W), molybdenum (Mo) or the like, which have a high resistance to a high sintering temperature.

The inductance L of the coil 16 can be represented by the equation (1):

$$L = \frac{(2\pi RN)^2}{l} \mu_r \cdot K \times 10^{-7} \; (H) \qquad (1)$$

where,

R . . . radius of the coil [m]
N . . . number of turns in the coil
l . . . length of the coil [m]
$\mu_r$ . . . specific magnetic permeability
K . . . Nagaoka's coefficient.

For example, when l = 2500 μm, R = 1000 μm, N = 10, and the inductance L is 120 nH. At a frequency of 1.8 GHz, the inductance L may be regarded as an impedance of 1.35 kΩ. Accordingly, when the coil 16 is inserted in the power feeding line, the coil 16 functions as a noise eliminating element, improving the noise elimination effect.

Other modifications of the formation of the high inductance element provided in the power supply line may be made in addition to that shown in FIG. 5. In FIG. 4, a high inductance component may be obtained by series-connecting the conductive members 14-5 to 14-7 through the conductive layer strips 11-2a" and 11-4a", however, the conductive layer strip 11-1a" between the conductive members 14-5 and 14-7 must be cut to make a series-connected conductive element having a high inductance. A high inductive element also may be obtained by inserting a folded wire into a throughhole, for example, throughhole 12-9 in FIG. 5.

In FIGS. 1 and 4, the viaholes and throughholes are normally formed with a circular cross section, however, this cross section may be formed in another shape, such as a square.

In addition, the insulation layers of the stacked layer unit 11 do not necessarily have the same thickness. Further more, the chip mounted on the package may be a single GaAs FET chip, not an IC.

Many widely different embodiments of the present invention may be constructed without departing from the spirit and scope of the present invention. It should be understood that the present invention is not limited to the specific embodiments described in this specification, except as defined in the appended claims.

We claim:

1. An integrated circuit device, comprising:
a plurality of stacked insulation layers;
a plurality of conductive layer strips, one of which is formed on a surface of each of said stacked insulation layers;
a chip, mounted on an uppermost one of said stacked insulation layers, and including a plurality of circuit elements;
first conductive means, formed in said stacked insulation layers and coupled to said chip and having a first inductance, for transferring high frequency signals to and from said circuit elements in said chip, said first conductive means comprising:
a first via hole formed in said stacked insulation layers; and
a first conductive material having first and second ends, formed in said first via hole, connected to one of said conductive layer strips at said first end and connected to another of said conductive layer strips at said second end;
second conductive means, formed in said stacked insulation layers and coupled to said chip and having a second inductance higher than said first inductance, for transferring low frequency signals, having frequencies lower than the frequencies of said high frequency signals, to and from said circuit elements in said chip, said second conductive means comprising:
a second via hole formed in said stacked insulation layers; and
a second conductive material having first and second ends, formed in said second via hole, connected to one of said conductive layer strips at said first end and connected to another of said conductive layer strips at said second end, said second conductive means having a size so that the second inductance is higher than the first inductance; and
package means for enclosing and hermetically sealing said stacked insulation layers, said chip, and said first and said second conductive means.

2. An integrated circuit device according to claim 1, wherein said first conductive means has a first cross-sectional area and said second conductive means has a second cross-sectional area smaller than said first cross-sectional area.

3. An integrated circuit device according to claim 2, wherein said first and said second conductive means are formed of the same type of conductive material.

4. An integrated circuit device according to claim 3 wherein the cross-sectional area of said first conductive means produces a predetermined inductance for said first signal.

5. An integrated circuit device according to claim 4, where in the cross-sectional area of said second conductive means produces a predetermined inductance, higher than that of said first conductive means, for said first signal.

6. An integrated circuit device according to claim 1, wherein said first conductive means has a first length along an axial line of said via hole and said second conductive means has a second length, longer than said first length along said axial line.

7. An integrated circuit device according to claim 6, wherein said first and said second conductive means are formed of the same type of conductive material.

8. An integrated circuit device according to claim 7, wherein said first length of said first conductive means produces a predetermined inductance for said first signal.

9. An integrated circuit device according to claim 8, wherein said second length of said second conductive means produces a predetermined inductance, higher than that of said first conductive means, for said first signal.

10. An integrated circuit device according to claim 1, wherein said first conductive means has a first cross-sectional area and a first length, and said second conductive means has a second cross-sectional area which is smaller than said first cross-sectional area and second length which is longer than said first length.

11. An integrated circuit device according to claim 10, wherein said first and said second conductive means are formed of the same type of conductive material.

12. An integrated circuit device according to claim 11, wherein said first length and said first cross-sectional area of said first conductive means produces a predetermined inductance for said first signal.

13. An integrated circuit device according to claim 12, wherein said second length and said second cross-sectional area of said second conductive means produces a predetermined inductance, higher than that of said first conductive means, for said first signal.

14. An integrated circuit device according to claim 1, wherein said second conductive means comprises a coil inserted in a throughhole.

15. An integrated circuit device, comprising:
   a stacked layer unit comprising stacked layers each layer including:
      an insulation layer; and
      a conductive layer formed on a surface of said insulation layer;
   a chip mounted on said stacked layer unit;
   first and second conductive means, formed in said stacked layer unit and connected to said chip, both for providing a conductive path to said chip, said first conductive means being supplied with a first signal of a first frequency and comprising:
      a first via hole formed in said stacked layer unit; and
      a first conductive material having first and second ends, in said first vial hole, said first end being connected to one of said conductive layers, and said second end being connected to another of said conductive layers, and having a first inductive property; and
   said second conductive means being supplied with a second signal of a second frequency lower than said first frequency and comprising:
      a second via hole formed in said stacked layer unit; and
      a second conductive material having first and second ends, in said second via hole, said first end being connected to one of said conductive layers and said second end being connected to another of said conductive layers, and having a second conductive property different from the first conductive property, said first conductive means exhibiting different inductive properties than the inductive properties exhibited by said second conductive means; and
   package means for enclosing and hermetically sealing said stacked layer unit and said chip.

16. An integrated circuit device according to claim 15, said first and second conductive materials having different cross sectional areas.

17. An integrated circuit device according to claim 15, said first and second conductive materials having different lengths.

18. An integrated circuit device according to claim 15, said first conductive materials having a first cross sectional area and a first length, and said second conductive material having a second cross sectional area different from said first cross sectional area and a second length different from said first length.

19. An integrated circuit device according to claim 15, wherein said first and said second conductive materials are the same type of conductive material.

20. An integrated circuit device according to claim 15, wherein said first and said second conductive materials are a different type of conductive material.

21. An integrated circuit device according to claim 19, wherein one of said first and said second conductive materials is a coil.

22. An integrated circuit device, comprising:
   a stacked layer unit comprising stacked layers, each layer including
      an insulation layer, and
      a conductive layer formed on a surface of said insulation layer;
   a chip mounted on said stacked layer unit;
   first conductive means, formed in said stacked layer unit and electrically coupled to said chip, for providing a conductive path to said chip, comprising
      a first via hole formed in said stacked layer unit; and
      a first conductive material having a first inductance being positioned in said first via hole and having a first end connected to one of said conductive layers, and a second end connected to another of said conductive layers;
   second conductive means formed in said stacked layer unit and electrically coupled to said chip and having a second inductance, for providing a conductive path to said chip, comprising:
      a second via hole formed in said stacked layer unit, and
      a second conductive material having a second inductive property different from the first inductive property, being positioned in said second via hole and having a first end connected to one of said conductive layers and said second end being connected to another of said conductive layers; and
   package means for enclosing and hermetically sealing said stacked layer unit and said chip, said first conductive means having an inductance lower than that of said second conductive means, said first conductive means being supplied with a high frequency signal, said second conductive means being supplied with a power signal having a lower frequency than that of said high frequency signal.

* * * * *